US008859332B2

(12) United States Patent
Steiger et al.

(10) Patent No.: US 8,859,332 B2
(45) Date of Patent: *Oct. 14, 2014

(54) PROCESS FOR PRODUCING INDIUM OXIDE-CONTAINING LAYERS

(75) Inventors: Juergen Steiger, Duesseldorf (DE); Duy Vu Pham, Oberhausen (DE); Heiko Thiem, Bensheim (DE); Alexey Merkulov, Ludwigshafen (DE); Arne Hoppe, Herne (DE)

(73) Assignee: Evonik Degussa GmbH, Essen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/884,495

(22) PCT Filed: Oct. 26, 2011

(86) PCT No.: PCT/EP2011/068736
§ 371 (c)(1),
(2), (4) Date: May 9, 2013

(87) PCT Pub. No.: WO2012/062575
PCT Pub. Date: May 18, 2012

(65) Prior Publication Data
US 2013/0221352 A1 Aug. 29, 2013

(30) Foreign Application Priority Data
Nov. 10, 2010 (DE) .................. 10 2010 043 668

(51) Int. Cl.
*H01L 21/16* (2006.01)
*H01L 29/10* (2006.01)
(Continued)

(52) U.S. Cl.
CPC ........ *H01L 21/02628* (2013.01); *H01L 21/288* (2013.01); *H01L 29/22* (2013.01); *C23C 18/1216* (2013.01); *H01L 29/43* (2013.01)
USPC ............. 438/104; 438/608; 438/609; 257/43; 427/126.3; 427/372.2; 427/379

(58) Field of Classification Search
USPC ............................ 438/104, 608, 609; 257/43; 427/96.1–99.5, 126.1–126.6, 372.2, 427/379
See application file for complete search history.

(56) References Cited

U.S. PATENT DOCUMENTS 8,137,794 B2 * 3/2012 Luethge et al. ............ 428/195.1
2010/0132788 A1 6/2010 Petrat et al.
(Continued)

FOREIGN PATENT DOCUMENTS

DE 10 2009 054 997 6/2011
WO 2010 018036 2/2010
(Continued)

OTHER PUBLICATIONS

International Search Report Issued Dec. 30, 2011 in PCT/EP11/68736 Filed Oct. 26, 2011.

(Continued)

*Primary Examiner* — Fernando L Toledo
*Assistant Examiner* — Karen Kusumakar
(74) *Attorney, Agent, or Firm* — Oblon, Spivak, McClelland, Maier & Neustadt, L.L.P.

(57) ABSTRACT

The present invention relates to a liquid phase process for producing indium oxide-containing layers, in which a coating composition preparable from a mixture comprising at least one indium oxide precursor and at least one solvent and/or dispersion medium, in the sequence of points a) to d), a) is applied to a substrate, and b) the composition applied to the substrate is irradiated with electromagnetic radiation, c) optionally dried and d) converted thermally into an indium oxide-containing layer, where the indium oxide precursor is an indium halogen alkoxide of the generic formula $InX(OR)_2$ where R is an alkyl radical and/or alkoxyalkyl radical and X is F, Cl, Br or I and the irradiation is carried out with electromagnetic radiation having significant fractions of radiation in the range of 170-210 nm and of 250-258 nm, to the indium oxide-containing layers producible with the process, and the use thereof.

16 Claims, 1 Drawing Sheet

(51) Int. Cl.
*H01L 21/12* (2006.01)
*B05D 5/12* (2006.01)
*H01L 21/288* (2006.01)
*H01L 29/22* (2006.01)
*C23C 18/12* (2006.01)
*H01L 21/02* (2006.01)
*H01L 29/43* (2006.01)

(56) References Cited

U.S. PATENT DOCUMENTS

| | | |
|---|---|---|
| 2011/0193084 A1 | 8/2011 | Thiem et al. |
| 2011/0309313 A1 | 12/2011 | Steiger et al. |
| 2011/0315982 A1 | 12/2011 | Hoppe et al. |
| 2012/0181488 A1 | 7/2012 | Steiger et al. |
| 2012/0202318 A1 | 8/2012 | Steiger et al. |
| 2012/0213980 A1 | 8/2012 | Arning et al. |
| 2012/0289728 A1 | 11/2012 | Steiger et al. |
| 2013/0104773 A1 | 5/2013 | Steiger et al. |
| 2013/0116463 A1 | 5/2013 | Steiger et al. |
| 2013/0122647 A1 | 5/2013 | Steiger et al. |

FOREIGN PATENT DOCUMENTS

| | | |
|---|---|---|
| WO | 2010 097270 | 9/2010 |
| WO | 2011 061111 | 5/2011 |
| WO | 2011 073005 | 6/2011 |
| WO | 2012 010427 | 1/2012 |
| WO | 2012 010464 | 1/2012 |

OTHER PUBLICATIONS

U.S. Appl. No. 14/348,948, filed Apr. 1, 2014, Steiger, et al.

\* cited by examiner

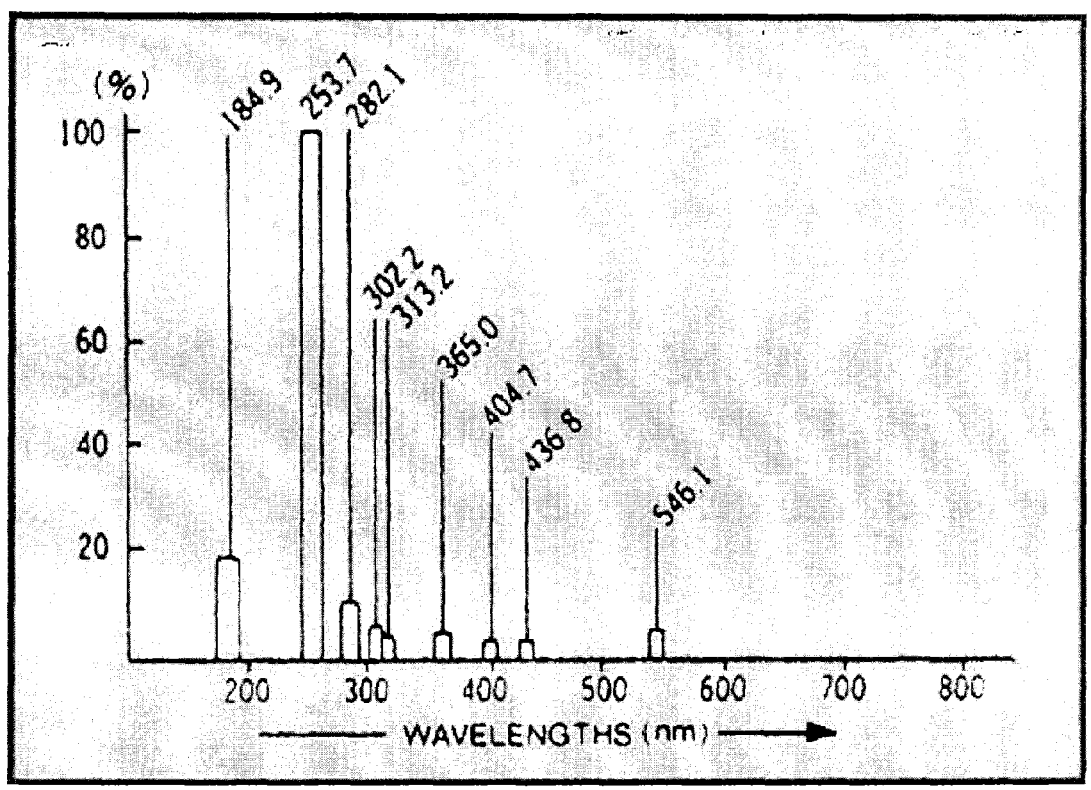

PROCESS FOR PRODUCING INDIUM OXIDE-CONTAINING LAYERS

FIELD OF THE INVENTION

The present invention relates to a process for producing indium oxide-containing layers, to the indium oxide-containing layers producible with the process of the invention, and to the use thereof.

The production of semiconducting electronic component layers by means of printing and other liquid deposition processes enables a simplification in terms of process technology and much lower production costs compared to many other processes, for example chemical vapour deposition (CVD), since the semiconductor can be deposited here in a continuous operation. Furthermore, in the case of lower operational temperatures, it becomes possible to work on flexible substrates as well, and optionally (especially in the case of very thin layers and more particularly with oxidic semiconductors) to achieve optical transparency in the printed layers. Semiconducting layers, here and below, are layers which have charge carrier mobilities of 1 to 50 $cm^2/Vs$ for a component with a channel length of 20 μm at a gate-source voltage of 50 V and a source-drain voltage of 50 V.

Since the material of the component layer to be produced via printing or other liquid deposition processes crucially determines the respective layer properties, the choice of this material has a significant influence on any component containing this component layer. Important parameters for printed semiconductor layers are their respective charge carrier mobilities and also the processing properties and processing temperatures of the printable precursors used in their production. The materials ought to have good charge carrier mobility and ought to be producible from solution and at temperatures well below 500° C., in order to be suitable for a multitude of applications and substrates. Likewise desirable for numerous innovative applications is optical transparency on the part of the semiconducting layers produced.

Indium oxide (indium(III) oxide, $In_2O_3$) has a large band gap between 3.6 and 3.75 eV (measured for layers applied by vapour deposition, H. S. Kim, P. D. Byrne, A. Facchetti, T. J. Marks; *J. Am. Chem. Soc.* 2008, 130, 12580-12581), making it a highly promising and therefore popularly used semiconductor. Thin films a few hundred nanometers in thickness, moreover, may have a high transparency in the visible spectral range, of more than 90% at 550 nm. In extremely highly ordered single indium oxide crystals, moreover, it is possible to measure charge carrier mobilities of up to 160 $cm^2/Vs$. To date, however, it has not been possible to attain such values by processing from solution (H. Nakazawa, Y. Ito, E. Matsumoto, K. Adachi, N. Aoki, Y. Ochiai; *J. Appl. Phys.* 2006, 100, 093706. and A. Gupta, H. Cao, Parekh, K. K. V. Rao, A. R. Raju, U. V. Waghmare; *J. Appl. Phys.* 2007, 101, 09N513).

Indium oxide is often used together with tin(IV) oxide ($SnO_2$) in the form of the semiconducting mixed oxide ITO. On account of the comparatively high conductivity of ITO layers, in conjunction with transparency in the visible spectral range, one of the applications of ITO is in the area of liquid crystal displays (LCD: liquid crystal display), especially as a "transparent electrode". These metal oxide layers, usually doped, are produced industrially in particular by costly vapour deposition methods under a high vacuum. Because of the great economic interest in ITO-coated substrates, there now exist certain coating processes, based especially on sol-gel techniques, for layers containing indium oxide.

In principle there are two options for the production of indium oxide semiconductors via printing processes: 1) particle approaches, in which (nano)particles are present in a printable dispersion and are converted after the printing operation into the desired semiconductor layer by sintering operations, and 2) precursor approaches, in which at least one soluble or dispersible precursor is reacted, after an appropriate composition has been printed, to form an indium oxide-containing layer. A precursor here is a compound which can be decomposed thermally or with electromagnetic radiation and can be used to form metal oxide-containing layers in the presence or absence of oxygen or other oxidants. The particle approach has two significant disadvantages as compared with the use of precursors: firstly, the particle dispersions have a colloidal instability, which necessitates the use of dispersing additives (which are disadvantageous in relation to the subsequent layer properties); secondly, many of the particles which can be used, on sintering, only form layers incompletely (owing to passivating layers, for example), meaning that there are still some particulate structures in the layers. At the particle boundary of such structures, there is considerable particle-particle resistance, which reduces the mobility of the charge carriers and increases the general layer resistance.

There is a variety of precursors for producing indium oxide layers. For instance, use may be made, as well as indium salts, of indium alkoxides (homoleptic compounds, i.e. compounds containing only indium and alkoxide radicals, more particularly indium compounds of the type $In(OR)_3$ with R=alkyl and/or oxyalkyl radical), and indium halogen alkoxides (i.e. indium compounds containing both halogen radicals and alkoxide radicals, more particularly trivalent indium compounds of the type $InX_m(OR)_{3-m}$ with X=halogen, R=alkyl and/or oxyalkyl radical, and m=1, 2) as precursors for producing indium oxide-containing layers.

DISCUSSION OF THE BACKGROUND

For example, Marks et al. describe components produced using a precursor-containing composition comprising the salt $InCl_3$ and the base monoethanolamine (MEA) in solution in methoxyethanol. Following spin coating of the composition, the corresponding indium oxide layer is produced by thermal treatment at 400° C. (H. S. Kim, P. D. Byrne, A. Facchetti, T. J. Marks; *J. Am. Chem. Soc.* 2008, 130, 12580-12581 and supplemental information).

As compared with compositions containing indium salt, compositions containing indium alkoxide and/or indium halogen alkoxide offer the advantage that they can be converted into indium oxide-containing coatings at lower temperatures. Moreover, it was hitherto assumed that halogen-containing precursors potentially had the disadvantage of leading to halogen-containing layers of reduced quality. For this reason, in the past, experiments on layer formation were performed using indium alkoxides.

Indium alkoxides and indium halogen alkoxides, and their synthesis, were described from as early as the 1970s.

For example Carmalt et al., in a review article, summarized the data known up until that point in time concerning synthesis, structure and reactivities of, among other compounds, indium(III) alkoxides and alkylalkoxides (Carmalt et al., Coord. Chem. Rev. 250 (2006), 682-709).

One of the oldest known syntheses of indium alkoxides is described by Chatterjee et al. They describe the preparation of indium trisalkoxide $In(OR)_3$ from indium(III) chloride ($InCl_3$) with sodium alkoxide NaOR, with R standing for methyl, ethyl, isopropyl, n-butyl, sec-butyl, tert-butyl and pentyl radicals (S. Chatterjee, S. R. Bindal, R. C. Mehrotra; *J. Indian Chem. Soc.* 1976, 53, 867).

Bradley et al. report on a similar reaction to that of Chatterjee et al., and with approximately identical reactants ($InCl_3$, isopropyl-sodium) and reaction conditions, obtain an indium oxo alkoxide cluster with oxygen as the central atom (D. C. Bradley, H. Chudzynska, D. M. Frigo, M. E. Hammond, M. B. Hursthouse, M. A. Mazid; *Polyhedron* 1990, 9, 719).

One particularly good variant of this process, leading to a particularly low level of chlorine contamination in the product, is described in US 2009-0112012 A1. The efforts to achieve as low as possible a level of chlorine impurities in the product are attributed there to the previous assumption that chlorine impurities contribute to a reduction in the performance or lifetime of electronic components (compare, for example, U.S. Pat. No. 6,426,425 B2).

Likewise based on an indium halide, but on different bases, is the process U.S. Pat. No. 5,237,081 A described for preparing pure indium alkoxides, by reacting an indium(III) halide in a basic medium with an alcohol. The base is said to be a strong base with low nucleophilicity. Bases exemplified, as well as complex cyclic heterocycles cited by way of example, include tertiary amines.

Alternative synthesis routes to homoleptic indium alkoxide complexes are described by Seigi Suh et al. in J. Am. Chem. Soc. 2000, 122, 9396-9404. The processes described therein, however, are very costly and inconvenient, and/or are based on reactants which are not available commercially (and must therefore, as a disadvantage, be synthesized in a step beforehand).

A general process for preparing halogen-alkoxy-metal compounds is described in U.S. Pat. No. 4,681,959 A: Described generally therein is a two-stage process for preparing metal alkoxides (especially tetraalkoxy compounds such as tetramethyl titanate), by reacting a halide of at least divalent metal with an alcohol—optionally in the presence of an aromatic solvent—initially to form an intermediate (a halogen-alkoxy compound of the metal). Hydrogen halide formed in the course of this reaction is preferably driven out using an inert gas such as nitrogen, for example.

Indium halogen alkoxides and their synthesis are also described in JP 02-113033 A and JP 02-145459 A. Accordingly, JP 02-113033 A discloses how chlorine-containing alkoxides of indium can be prepared, following dissolution of indium chloride in an alcohol corresponding to the alkoxide radical to be installed, by subsequent addition of a particular fraction of an alkali metal or of an alkali metal alkoxide. A process of this kind is also described by JP 02-145459 A.

The preparation of indium oxide-containing layers from indium alkoxides and indium halogen alkoxides may take place in principle i) by sol-gel procedures, in which the precursors used react in the presence of water, by hydrolysis and subsequent condensation, initially to form gels, and are then converted into metal oxides, or ii) from nonaqueous solution. The conversion to indium oxide-containing layers may take place thermally and/or by electromagnetic radiation.

Processes for preparing indium oxide-containing layers by thermal conversion are part of the prior art. WO 2008/083310 A1, for example, describes processes for producing inorganic layers or organic/inorganic hybrid layers on a substrate by applying to said substrate a metal oxide (e.g. one of the generic formula $R^1M(OR^2)_{y-x}$), or a prepolymer thereof, and then curing the resultant metal oxide layer in the presence of water, with reaction with water, while supplying heat. Among the metal alkoxides which can be used is an indium alkoxide. Following the conversion, the layer obtained may be treated subsequently with heat or UV.

JP 01-115010 A as well is concerned with a thermal conversion in a sol-gel procedure. This document describes compositions for transparent, thin, conducting layers that have a long pot life, do not, as a composition, undergo hydrolysis, and comprise chlorine-containing indium alkoxides of the formula $In(OR)_xCl_{3-x}$. These compositions can be converted following application to a substrate, gelling of the alkoxide on the substrate by the water fraction in air, and subsequent drying at up to 200° C., with conversion taking place at temperatures of 400-600° C.

JP 02-113033 A describes processes for applying an antistatic coating to a non-metallic material, by coating the non-metallic material with a composition comprising a chlorine-containing indium alkoxide, gelling the composition in air, and then calcining it.

JP 2007-042689 A describes metal alkoxide solutions, which can comprise indium alkoxides, and also processes for producing semiconductor components using these metal alkoxide solutions. The metal alkoxide solutions can be converted to form the oxide layer by means of a thermal treatment.

JP 02-145459 A describes coating compositions which contain indium halogen alkoxide, which do not undergo hydrolysis in the course of storage, and which can be converted, by calcining, into an indium oxide-containing layer.

JP 59-198607 A describes processes for producing transparent conducting layers which can have a protective film of various resins. The transparent conducting layer may be an indium oxide-containing layer, and may be produced via a liquid phase process in which a corresponding composition is applied to a substrate, dried, and converted thermally. According to the examples, a composition comprising InCl$(OC_3H_7)_2$ can be used.

JP 59-198606 A describes compositions for the formation of transparent, electrically conducting layers, comprising $InCl_x(OR)_{3-x}$ and an organic solvent and having a water fraction of 0.1%-10%, based on the organic solvent. Such a composition, accordingly, is a sol of an indium halogen alkoxide. To form the transparent conducting layer, the composition is applied to a substrate and dried at typically 150° C., and then baked at temperatures of preferably 300° C.

Conversion carried out by means of heat alone, however, has the disadvantage that it cannot be used to produce fine structures and that, furthermore, it does not allow precise control over the resulting layer properties.

For this reason, processes for converting to indium oxide-containing layers were developed which are based on the use of electromagnetic radiation (especially UV radiation).

For instance, JP 09-157855 A describes a sol-gel process for producing a metal oxide layer, by applying to the surface of a substrate a metal oxide sol prepared by hydrolysis and composed of a metal alkoxide or a metal salt (e.g. an indium alkoxide or indium salt), said application taking place optionally at a temperature at which the gel still does not crystallize, and being followed by drying and by UV irradiation at less than 360 nm.

Conversions which take place exclusively by radiation, however, have the disadvantage that they require very high energy densities over a relatively long time and are therefore very costly and inconvenient in terms of apparatus. For this reason, processes were developed which are based not only on thermal conversion but also on conversion using electromagnetic radiation.

JP 2000-016812 A describes a process for producing a metal oxide layer via a sol-gel process. In this process, the substrate is coated with a coating composition of a metal oxide sol comprising a metal salt or metal alkoxide, more particularly an $In_2O_3$—$SnO_2$ composition, and the coating is irradiated with UV radiation at a wavelength of less than 360 nm, and subjected to heat treatment.

JP 11-106935 A describes a process for producing an oxide-based transparent conducting film, in which inter alia an anhydrous composition comprising an alkoxide of a metal (e.g. indium) is applied to a substrate and heated. The film may also be subsequently converted using UV or VIS radiation into a metal oxide-based thin layer.

DE 10 2009 054 997 describes liquid phase processes for producing indium oxide-containing layers from non-aqueous solution, by applying an anhydrous composition comprising at least one solvent or dispersion medium and at least one precursor of the formula $InX(OR)_2$ to a substrate in an anhydrous atmosphere and subjecting it to irradiation with electromagnetic radiation <360 nm and to thermal conversion.

The known processes for producing indium oxide-containing layers via combined thermal conversion and conversion with electromagnetic radiation, however, have the disadvantage that the use of the indium alkoxides described exhaustively in the literature exhibits much poorer semiconducting properties. Furthermore, even the combination of thermal conversion with conversion by means of electromagnetic or UV radiation alone does not result in sufficiently satisfactory results, particularly in relation to the resultant field-effect mobilities $\mu_{FET}$. The problem posed, therefore, is that of overcoming the outlined disadvantages of the prior art and of providing an improved process for producing indium oxide-containing layers.

DESCRIPTION OF THE INVENTION

This problem is solved in accordance with the invention by means of the liquid-phase process for producing indium oxide-containing layers according to Claim 1, in which a coating composition preparable from a mixture comprising at least one indium oxide precursor and at least one solvent and/or dispersion medium, in the sequence of points a) to d),
   a) is applied to a substrate, and
   b) the composition applied to the substrate is irradiated with electromagnetic radiation,
   c) optionally dried and
   d) converted thermally into an indium oxide-containing layer,
   wherein
      the indium oxide precursor is an indium halogen alkoxide of the generic formula $InX(OR)_2$ where R is an alkyl radical and/or alkoxyalkyl radical and X is F, Cl, Br or I and
      the irradiation with electromagnetic radiation is carried out with significant fractions of radiation in the range of 170-210 nm and of 250-258 nm.

The liquid phase process of the invention for producing indium oxide-containing layers is a process including at least one process step in which the substrate to be coated is coated with a liquid coating composition based on at least one indium halogen alkoxide of the generic formula $InX(OR)_2$, where R=alkyl radical and/or alkoxyalkyl radical and X=F, Cl, Br or I, irradiated with electromagnetic radiation, optionally then dried and subsequently converted thermally. In particular, this operation is not a sputtering or CVD operation. Liquid compositions in the context of the present invention are compositions which are in liquid form under SATP conditions ("Standard Ambient Temperature and Pressure"; T=25° C. and p=1013 hPa) and on application to the substrate that is to be coated.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, where:

FIG. 1. Spectrum of the Model 144AX-220 low pressure mercury lamp from Jelight Company, Inc.

A coating composition preparable from a mixture comprising the at least one indium oxide precursor of the generic formula $InX(OR)_2$ comprehends not only coating compositions comprising the precursor $InX(OR)_2$ but also coating compositions comprising (optionally in addition to $InX(OR)_2$) indium oxo alkoxides or indium halogen oxo alkoxides that are preparable from $InX(OR)_2$ in a mixture with the at least one solvent or dispersion medium (especially those alkoxides of the generic formulae $In_7O_2(OH)(OR)_{12}X_4(ROH)_x$ or $In_6O_2X_6(OR)_6(R'CH(O)COOR'')_2(HOR)_x(HNR'''_2)_y$). Preferably, however, the process of the invention is carried out with coating compositions comprising $InX(OR)_2$.

The process product of the process of the invention, the indium oxide-containing layer, is understood to mean a metal- or semimetal-containing layer which has indium atoms and/or indium ions present substantially in oxidic form. The indium oxide-containing layer may optionally also have nitrogen fractions (from the reaction), carbon fractions (especially carbene), halogen fractions and/or alkoxide fractions from an incomplete conversion or incomplete removal of by-products that are formed. This indium oxide-containing layer may be a pure indium oxide layer, i.e. neglecting any nitrogen, carbon (especially carbene), alkoxide or halogen fractions, it may consist substantially of indium atoms and/or ions in oxidic form, or may fractionally also include further metals, semimetals or non-metals, which themselves may be in elemental or oxidic form. In order to produce pure indium oxide layers, only indium halogen alkoxides, preferably only one indium halogen alkoxide, ought to be used in the process of the invention. Conversely, in order to produce layers comprising other metals, semimetals and/or non-metals as well, precursors of these elements in the 0 oxidation state (to produce layers comprising other metals in neutral form) and/or oxygen-containing precursors comprising the elements in a positive oxidation state (such as other metal alkoxides or metal halogen alkoxides, for example) ought to be used in addition to the indium halogen alkoxides.

Surprisingly it has also been found that the assumption hitherto that halogen-containing precursors inevitably lead to disadvantageous layers is not always correct. For instance, in the process of the invention, when a liquid indium oxide precursor composition is applied to a substrate and the coating film is treated initially with UV radiation prior to thermal conversion, the use of indium chlorine dialkoxides rather than indium alkoxides in fact results in better layers, since these layers have better electrical properties, more particularly a higher field-effect mobility. Furthermore, when indium halogen dialkoxides are used instead of indium alkoxides, surprisingly, more amorphous layers can be obtained. As compared with a layer of individual nanocrystals, amorphous layers possess the advantage of a greater homogeneity, and this is likewise manifested in better electrical properties, especially more homogeneous field-effect mobilities on larger substrates.

Irradiation with electromagnetic radiation takes place, in accordance with the invention, using electromagnetic radiation with significant fractions of radiation in the range of 170-210 nm and of 250-258 nm. Radiation "with significant fractions of radiation in the range of 170-210 nm and of 250-258 nm" here means radiation whose intensity, determined cumulatively for these two wavelength ranges, based on the sample to be irradiated, amounts to at least 5 mW/cm$^2$, with the proviso that the weaker of the two ranges in terms of intensity always accounts for a substrate-related intensity of at least 0.5 mW/cm$^2$. The absolute values can be measured directly and wavelength-dependently using various commercial apparatuses. As an example, mention may be made of the "UV Power Meter C9536" from Hamamatsu.

It is preferred—since it results in particularly good values for $\mu_{FET}$—to irradiate the coating with electromagnetic radiation having significant fractions of radiation in the range of 183-187 nm and of 250-258 nm, again on the basis of a corresponding understanding of the term "having significant fractions" (the intensity determined cumulatively for these two wavelength ranges, based on the sample to be irradiated, is at least 5 mW/cm$^2$, with the proviso that the weaker of the two ranges in terms of intensity always accounts for a substrate-related intensity of at least 0.5 mW/cm$^2$).

Particularly good results are achieved, furthermore, when the radiation having significant fractions of radiation in the range of 170-210 nm and of 250-258 nm, more preferably such radiation having significant fractions in the range of 183-187 nm and of 250-258 nm, in an intensity/wavelength spectrum scaled in each case linearly in relation to the two axes, over the entire emission of the lamp, exhibits at least 85% of its intensity (determined via the percentage fraction of the sum of the integrals of the sub-ranges, as a proportion of the overall radiation intensity determined as an integral over all the wavelengths of the spectrum) within the two ranges identified in each case.

Corresponding radiation having significant fractions of radiation in the range of 170-210 nm and of 250-258 nm can be generated preferably by using low-pressure mercury vapour lamps, more particularly low-pressure quartz-glass mercury vapour lamps. One quartz-glass low-pressure mercury vapour lamp which can be used with particular preference is a lamp which is equipped with the GLF-100 illuminant and is available under the trade name Model 144AX-220 from Jelight Company, Inc., the spectrum thereof being depicted in FIG. 1.

The indium oxide precursors InX(OR)$_2$ for use in accordance with the invention preferably have alkyl and/or alkyloxyalkyl radicals R selected from the group of C1 to C15 alkyl or alkyloxyalkyl groups, i.e. alkyl or alkyloxyalkyl groups having a total of 1-15 carbon atoms. Preferred alkyl and/or alkyloxyalkyl radicals R are selected from —CH$_3$, —CH$_2$CH$_3$, —CH$_2$CH$_2$OCH$_3$, —CH(CH$_3$)$_2$ or —C(CH$_3$)$_3$.

An indium halogen alkoxide may contain identical or different radicals R. For the process of the invention, however, it is preferred to use indium halogen alkoxides which have the same alkyl and/or alkyloxyalkyl radical R.

All halogens may in principle be used in the indium halogen alkoxide. Especially good results, however, are achieved using indium chlorine alkoxides, i.e. when X=Cl.

Optimum results are achieved when the indium halogen alkoxide used is InCl(OMe)$_2$, InCl(OCH$_2$CH$_2$OCH$_3$), InCl(OEt)$_2$, InCl(OiPr)$_2$ or InCl(OtBu)$_2$.

The indium halogen alkoxide InX(OR)$_2$ is used preferably in fractions of 0.1% to 10% by weight, more preferably 0.5% to 6% by weight, very preferably 1% to 5% by weight, based on the total mass of the composition.

The composition comprising the indium halogen alkoxide may comprise the alkoxide in solution, i.e. dissociated, or complexed at the molecular level, with solvent molecules, or in dispersion in liquid phase.

Where only indium-containing precursors are used, the process of the invention is especially suitable for producing In$_2$O$_3$ layers featuring high quality and good properties. Particularly good layers result when the only precursor used is an indium halogen alkoxide.

Besides the indium halogen alkoxide, however, the composition may also comprise other precursors, preferably alkoxides and halogen alkoxides of other elements, in solution or in dispersion. Particularly preferred are alkoxides and halogen alkoxides of B, Al, Ga, Ge, Sn, Pb, P, Hf, Zn and Sb. Alkoxides and halogen alkoxides which can be used with very particular advantage are the compounds Ga(OiPr)$_3$, Ga(OtBu)$_3$, Zn(OMe)$_2$, Sn(OtBu)$_4$. Accordingly, indium oxide-containing layers which additionally comprise the elements B, Al, Ga, Ge Sn, Pb, P, Zn and Sb, and/or their oxides, can be produced using these compounds.

The composition further comprises at least one solvent and/or dispersion medium. Hence the composition may also comprise two or more solvents and/or dispersion media. In order to achieve particularly good indium oxide-containing layers, however, only one solvent or dispersion medium ought to be present in the composition.

Solvents and dispersion media that can be used with preference are aprotic and weakly protic solvents and dispersion media, i.e. those selected from the group of the aprotic nonpolar solvents/dispersion media, i.e. the alkanes, substituted alkanes, alkenes, alkynes, aromatics with or without aliphatic or aromatic substituents, halogenated hydrocarbons, tetramethylsilane, the group of aprotic polar solvents/dispersion media, i.e. the ethers, aromatic ethers, substituted ethers, esters or acid anhydrides, ketones, tertiary amines, nitromethane, DMF (dimethylformamide), DMSO (dimethyl sulphoxide) or propylene carbonate, and the weakly protic solvents/dispersion media, i.e. the alcohols, the primary and secondary amines, and formamide. Solvents and dispersion media which can be used with particular preference are alcohols and also toluene, xylene, anisole, mesitylene, n-hexane, n-heptane, tris(3,6-dioxa-heptyl)amine (TDA), 2-aminomethyltetrahydrofuran, phenetole, 4-methylanisole, 3-methylanisole, methyl benzoate, butyl acetate, ethyl lactate, methoxyethanol, butoxyethanol, 1-methoxy-2-propanol, N-methyl-2-pyrrolidone (NMP), tetralin, ethyl benzoate and diethyl ether. Especially preferred solvents and dispersion media are methanol, ethanol, isopropanol, tetrahydrofurfuryl alcohol, tert-butanol, butyl acetate, ethyl lactate, methoxyethanol, 1-methoxy-2-propanol and toluene, and also mixtures thereof. On account of their low toxicity, the solvents ethanol, isopropanol, tetrahydrofurfuryl alcohol, tert-butanol, butyl acetate, ethyl lactate, 1-methoxy-2-propanol and toluene are even further preferred.

The solvent and/or dispersion medium is used preferably in fractions of 99.9% to 90% by weight, based on the total mass of the composition.

In order to achieve particularly good printability, the composition used in the process of the invention preferably has a viscosity of 1 mP·s to 10 Pa·s, more particularly 1 mPa·s to 100 mPa·s, determined in accordance with DIN 53019 parts 1 and 2, and measured at 20° C. Such viscosities can be set by adding polymers, cellulose derivatives, or SiO$_2$, available for example under the trade name Aerosil, and more particularly preferably by means of PMMA, polyvinyl alcohol, urethane thickeners or polyacrylate thickeners.

The substrate which is used in the process of the invention is preferably a substrate consisting of glass, silicon, silicon dioxide, a metal oxide or transition metal oxide, a metal or polymeric material, more particularly PI, PEN, PEEK, PC or PET.

The process of the invention is with particular advantage a coating process selected from printing processes (more particularly flexo/gravure printing, inkjet printing, very preferably continuous, thermal or piezo inkjet printing, or offset printing, including digital offset printing, and screenprinting), spraying processes, rotational coating processes (spin coating), deposition processes (dip coating), and processes selected from meniscus coating, slit coating, slot-die coating, and curtain coating. Very preferably indeed, the process of the invention is a printing process. Particularly suitable printing processes include inkjet and also liquid toner processes (such as HP Indigo, for example), since these processes are especially suitable for patterned application of the printing material.

As already stated, irradiation takes place with radiation having significant fractions of radiation in the range of 170-210 nm and of 250-258 nm. In this case, the results obtained are especially good when the irradiation is carried out in the presence of oxygen ($O_2$). Especially good results are achieved when the irradiation takes place within an atmosphere containing 15-25% by volume of oxygen. The use of oxygen in the process of the invention has the advantage that, as a result of the selected wavelengths, atomic oxygen (O) and/or ozone ($O_3$) are generated selectively from $O_2$, and these species react with the organic radicals of the precursor and thereby lower the temperature required for thermal conversion to an indium oxide-containing layer of a defined quality.

The process of the invention can be used to particularly good effect to produce patterned semiconductor areas if the irradiation in step b) takes place through a mask which ordains the pattern in question. The atomic oxygen formed reacts with and/or removes organic precursor constituents at the locations accessible through the mask. The areas selectively irradiated accordingly are, consequently, less resistant to workup, after heat treatment, than unirradiated areas. After the heat treatment, the unirradiated areas can be removed simply by using acids, especially weak acids (more preferably 0.1 M oxalic acid). The invention thus also provides a corresponding process in which the irradiation in step b) takes place through a mask which ordains the pattern in question, and, after heat treatment, in a step e), unirradiated areas are removed using aqueous acids. Particularly preferred mask types are contact masks and shadow masks. A contact mask is a mask which lies on the sample and has cutouts or areas of thinner material (more particularly, holes) at the locations at which the patterning is to occur. One particularly preferred type of contact mask is an etched or laser-cut metal sheet with cutouts that produce the eventual layout. In contrast to a contact mask, a shadow mask is used at a certain distance from the sample when patterning. Preferred shadow masks consist of quartz glass, since quartz glass has the advantage of being transparent for UV light. The areas shaded off are preferably vapour-coated with chromium, and prevent passage of UV light. Shadow masks of this kind are often also referred to as chromium glass masks. It is preferred to use shadow masks rather than contact masks, since they have the advantage of not being used in direct contact with the sample surface.

The process of the invention for producing indium oxide-containing layers is also equally suitable in principle for implementation in the absence or presence of water. Implementations "in the presence of water" here mean, in particular, sol-gel processes where the indium oxide precursor, prior to irradiation, is reacted in the presence of water to form a gel, which is then irradiated. Preferably, however, since it simplifies the process regime, the process of the invention is not carried out as a sol-gel process.

In principle, moreover, the process of the invention can be carried out in a completely anhydrous atmosphere (i.e., an atmosphere containing less than 500 ppm of water) and with anhydrous compositions (i.e., those containing likewise less than 500 ppm of water), or in/with corresponding water-containing atmospheres and compositions. In order to obtain particularly good results, and particularly for obtaining extremely smooth surfaces, the relative atmospheric humidity is not more than 70%.

After coating and irradiation, and before converting, the coated substrate is also preferably dried. Corresponding measures and conditions for this purpose are known to the skilled person. Drying differs from converting in that it entails removal of the solvent and/or dispersion medium at temperatures which do not as yet produce substantially any transformation of the material. Where drying is accomplished thermally, the temperature is not more than 120° C.

Final conversion into an indium oxide-containing layer takes place thermally. The final converting takes place preferably by means of temperatures of lower than 500° C. and higher than 120° C. Particularly good results can be achieved, however, if converting is carried out using temperatures of 150° C. to 400° C. Methods for achieving these temperatures are based preferably on the utilization of ovens, hot air, hotplates, IR emitters, and electron beam devices.

It is typical here to use conversion times ranging from a few seconds through to several hours.

The thermal conversion may be supported, furthermore, by irradiation of the coated substrate with UV, IR or VIS radiation, before, during or after thermal treatment, or by treating the coated substrate with air and/or oxygen.

The quality of the layer produced by the process of the invention can also be improved further by means of a combined temperature and gas treatment (with $H_2$ or $O_2$), plasma treatment (Ar, $N_2$, $O_2$ or $H_2$ plasma), laser treatment (with wavelengths in the UV, VIS or IR range) or ozone treatment, following the converting step.

The coating operation can be repeated in order to increase the thickness. In this case, the coating operation may take a form in which, following each individual application, the coating is irradiated with electromagnetic radiation and then converted, or else there are two or more applications, each followed by electromagnetic irradiation, with a single thermal converting step following the last application.

The invention further provides the indium oxide-containing layers producible by way of the process of the invention. Particularly good properties are possessed in this case by indium oxide-containing layers producible by way of the process of the invention and being pure indium oxide layers. As already stated above, they are produced using only indium-containing precursors, preferably only indium halogen alkoxides, more preferably only one indium halogen alkoxide.

The indium oxide-containing layers producible by way of the process of the invention are suitable advantageously for producing conducting or semiconducting layers for electronic components, more particularly for producing transistors (especially thin-film transistors), diodes, sensors or solar cells.

Without having any restricting effect themselves, the examples which follow are intended to elucidate in more detail the subject matter of the present invention.

EXAMPLES

Inventive Example

Indium Chlorine Alkoxide as Precursor

100 μl of a 1.0% by weight solution of InCl(OMe)$_2$ in ethanol were applied to a doped silicon substrate having an edge length of approximately 15 mm, with a silicon oxide coating around 200 nm thick and with finger patterns made of ITO/gold. This is followed by spin coating at 2000 rpm (5 seconds). Directly after this coating procedure, the coated substrate is irradiated for 5 minutes with UV radiation from a mercury vapour lamp (illuminant GLF-100, Jelight 144AX-220, quartz glass, Jelight) in the wavelength range of 150-300 nm. The substrate is then heated for an hour on a hotplate at a temperature of 350° C. Following conversion, a field-effect mobility $\mu_{FET}$ value of 8.5 cm$^2$/Vs can be determined in a glove box.

Comparative Example

Indium Alkoxide as Precursor

100 μl of a 1.0% by weight solution of In(OiPr)$_3$ in ethanol were applied to a doped silicon substrate having an edge length of approximately 15 mm, with a silicon oxide coating around 200 nm thick and with finger patterns made of ITO/gold. This is followed by spin coating at 2000 rpm (5 seconds). Directly after this coating procedure, the coated substrate is irradiated for 5 minutes with UV radiation from a mercury vapour lamp (illuminant GLF-100, Jelight 144AX-220, quartz glass, Jelight) in the wavelength range of 150-300 nm. The substrate is then heated for an hour on a hotplate at a temperature of 350° C. Following conversion, a field-effect mobility $\mu_{FET}$ value of 3.8 cm$^2$/Vs can be determined in a glove box.

Comparative Example

Indium Chlorine Alkoxide as Precursor and Alternative UV Source

100 μl of a 1.0% by weight solution of InCl(OMe)$_2$ in ethanol were applied to a doped silicon substrate having an edge length of approximately 15 mm, with a silicon oxide coating around 200 nm thick and with finger patterns made of ITO/gold. This is followed by spin coating at 2000 rpm (5 seconds). Directly after this coating procedure, the coated substrate is irradiated for 5 minutes with UV radiation from a mercury vapour lamp (illuminant GLG-100, Jelight 144AX-220, ozone-free, Jelight, no radiation at wavelengths <210 nm) in the wavelength range of 230-350 nm. The substrate is then heated for an hour on a hotplate at a temperature of 350° C. Following conversion, a field-effect mobility $\mu_{FET}$ value of 4.5 cm$^2$/Vs can be determined in a glove box.

The invention claimed is:

1. A liquid phase process for producing an indium oxide-comprising layer, the process comprising:
   a) applying a coating composition to a substrate,
   b) subsequently irradiating the coating composition with electromagnetic radiation,
   c) then optionally drying the coating composition, and
   d) finally thermally converting the coating composition into the indium oxide-comprising layer,
   wherein
   the coating composition is prepared by a process comprising: mixing at least one indium oxide precursor with at least one solvent, a dispersion medium, or both;
   the at least one indium oxide precursor is an indium halogen alkoxide of formula InX(OR)$_2$, wherein
      R is an alkyl radical, an alkoxyalkyl radical, or both, and
      X is F, Cl, Br or I; and
   the electromagnetic radiation is carried out with significant fractions of radiation in ranges of 170-210 nm and 250-258 nm.

2. The process according to claim 1, wherein the electromagnetic radiation is carried out with significant fractions of radiation in ranges of 183-187 nm and 250-258 nm.

3. The process according to claim 1, wherein the electromagnetic radiation takes place using a low-pressure mercury vapour lamp.

4. The process according to claim 1, wherein the alkyl radical or the alkoxyalkyl radical of the indium halogen alkoxide comprises C1 to C15 alkoxy or alkyloxyalkyl groups.

5. The process according to claim 1, wherein the indium halogen alkoxide is InCl(OMe)$_2$, InCl(OCH$_2$CH$_2$OCH$_3$)$_2$, InCl(OEt)$_2$, InCl(OiPr)$_2$ or InCl(OtBu)$_2$.

6. The process according to claim 1, wherein the indium halogen alkoxide InX(OR)$_2$ is in a fraction of from 0.1% to 10% by weight, based on a total mass of the coating composition.

7. The process according to claim 1, wherein the coating composition further comprises other precursors in solution or dispersion.

8. The process according to claim 1, wherein the at least one solvent or dispersion medium is methanol, ethanol, isopropanol, tetrahydrofurfuryl alcohol, tert-butanol, butyl acetate, methoxyethanol, 1-methoxy-2-propanol, or toluene.

9. The process according to claim 1, wherein the at least one solvent or dispersion medium is in a fraction of from 90% to 99.9% by weight, based on a total mass of the coating composition.

10. The process according claim 1, wherein the electromagnetic radiation in said irradiating step b) is carried out in oxygen 0$_2$.

11. The process according to claim 10, wherein the electromagnetic radiation in said irradiating step b) takes place through a mask which ordains a pattern so as to produce a patterned indium oxide-comprising layer.

12. The process according to claim 11, further comprising
   e) after said thermally converting step d), removing unirradiated areas through use of aqueous acids.

13. The process according to claim 1,
wherein
said thermally converting step d) takes place at a temperature lower than 500° C. and higher than 120° C.

14. An indium oxide-comprising layer produced by the according to claim 1.

15. A conducting or semiconducting layer for electronic components comprising the indium oxide-comprising layer according to claim 14.

16. The process according to claim 7,
wherein the other precursors are alkoxides or halogen alkoxides of B, Al, Ga, Ge, Sn, Pb, P, Hf, Zn and Sb.

* * * * *